(12) United States Patent
Jeong

(10) Patent No.: US 9,129,352 B2
(45) Date of Patent: Sep. 8, 2015

(54) OPTICAL PROXIMITY CORRECTION MODELING METHOD AND SYSTEM

(71) Applicant: SAMSUNG ELECTRONICS CO., LTD., Suwon-si, Gyeonggi-do (KR)

(72) Inventor: Moon-Gyu Jeong, Gwangmyeong-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 157 days.

(21) Appl. No.: 13/927,912

(22) Filed: Jun. 26, 2013

(65) Prior Publication Data

US 2014/0064600 A1 Mar. 6, 2014

(30) Foreign Application Priority Data

Aug. 30, 2012 (KR) .................. 10-2012-0095862
Nov. 14, 2012 (KR) .................. 10-2012-0128939

(51) Int. Cl.
*G06K 9/00* (2006.01)
*G06T 7/00* (2006.01)
*G03F 7/20* (2006.01)
*G03F 1/36* (2012.01)

(52) U.S. Cl.
CPC .......... *G06T 7/0004* (2013.01); *G03F 7/70441* (2013.01); *G03F 1/36* (2013.01)

(58) Field of Classification Search
CPC ... G06T 7/0004; G03F 7/70441; H04L 45/02; H04L 45/123; H04L 45/125; H04L 45/42; H04L 47/12
See application file for complete search history.

(56) References Cited

U.S. PATENT DOCUMENTS

| 5,953,115 | A | 9/1999 | Landers et al. | |
| 6,803,160 | B2* | 10/2004 | Johnstone et al. | 430/5 |
| 6,893,800 | B2 | 5/2005 | Jessen et al. | |
| 7,230,678 | B2* | 6/2007 | Bruebach | 355/71 |
| 7,271,877 | B2* | 9/2007 | Fries | 355/67 |

(Continued)

FOREIGN PATENT DOCUMENTS

| KR | 10-0362242 | 11/2002 |
| KR | 10-2007-0078566 | 8/2007 |
| KR | 10-0801737 | 1/2008 |
| KR | 10-2011-0010441 | 2/2011 |

OTHER PUBLICATIONS

English Abstract for Publication No. 10-2011-0010441.

(Continued)

*Primary Examiner* — Tom Y Lu
(74) *Attorney, Agent, or Firm* — F. Chau & Associates, LLC

(57) ABSTRACT

An optical proximity correction modeling method for predicting a topography effect due to a pattern stack structure that includes a first material pattern, a second material pattern, and a boundary region between the first material pattern and the second material pattern. The method includes generating a first region filter that corresponds to the first material pattern, a second region filter that corresponds to the second material pattern, and an edge function corresponding to the boundary region; generating a bulk image signal from a layout using the first region filter and the second region filter; generating an edge image signal from the layout using the edge function, a characteristic kernel that represents characteristics of the boundary region, the first region filter, and the second region filter; and generating a final model signal from the bulk image signal and the edge image signal.

20 Claims, 15 Drawing Sheets

(56) References Cited

U.S. PATENT DOCUMENTS

| | | | |
|---|---|---|---|
| 8,079,656 B2 * | 12/2011 | Srinivasan et al. | 347/5 |
| 2004/0101268 A1 | 5/2004 | Shih et al. | |
| 2010/0167189 A1 | 7/2010 | Del Puerto | |
| 2010/0265479 A1 | 10/2010 | De Winter et al. | |
| 2011/0029940 A1 | 2/2011 | Song et al. | |

OTHER PUBLICATIONS

English Abstract for Publication No. 10-0801737.
English Abstract for Publication No. 10-0362242.
English Abstract for Publication No. 10-2007-0078566.

* cited by examiner

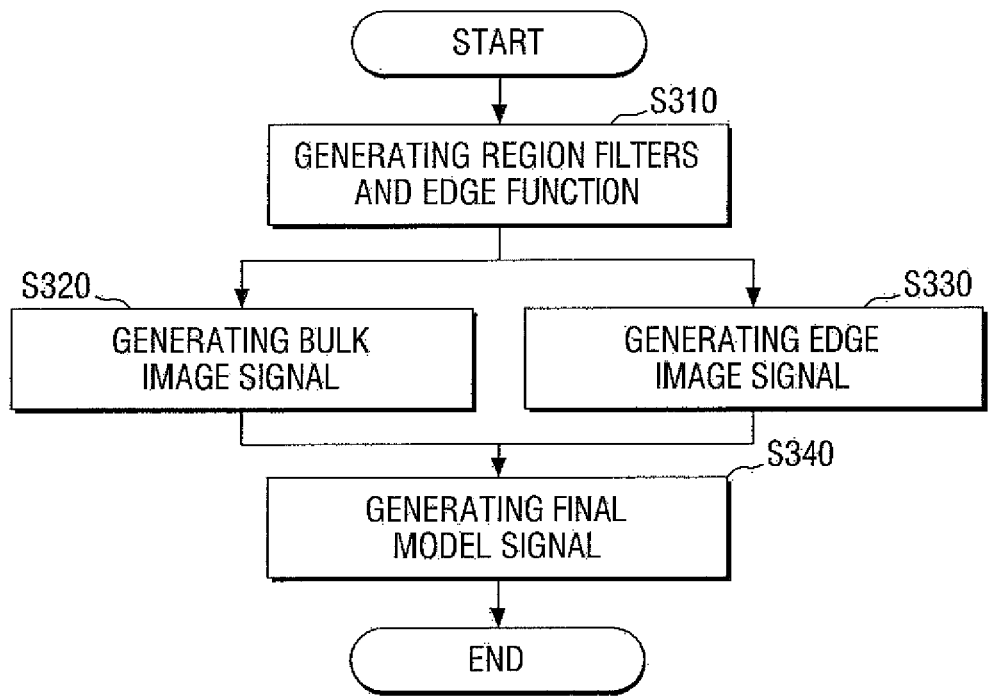

Fig. 12
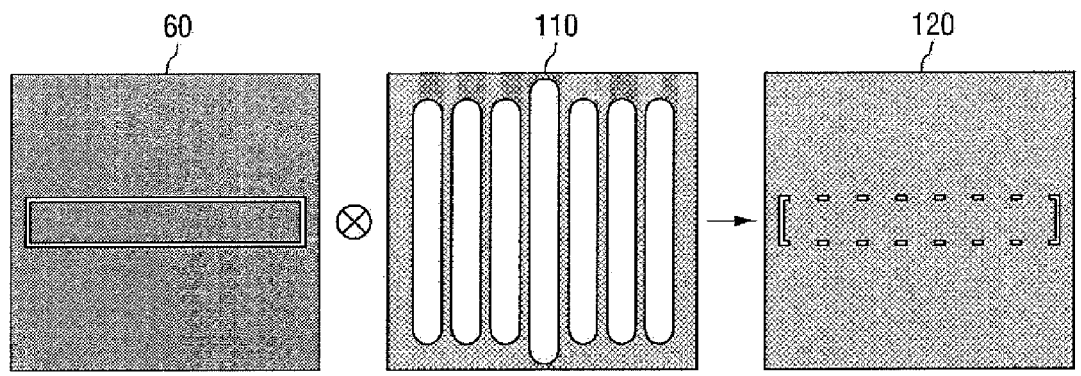
Fig. 13
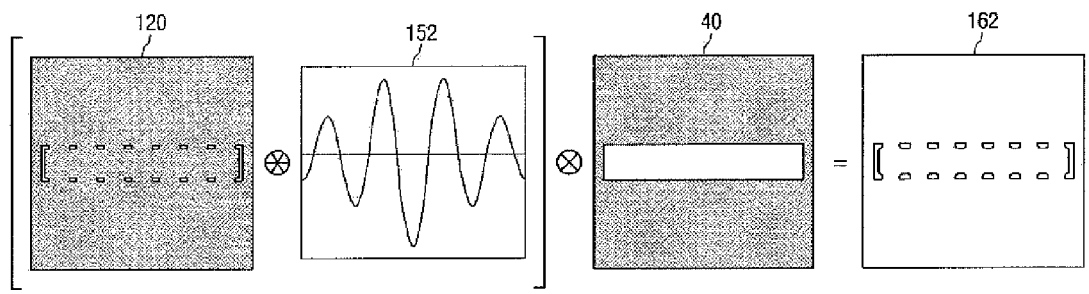
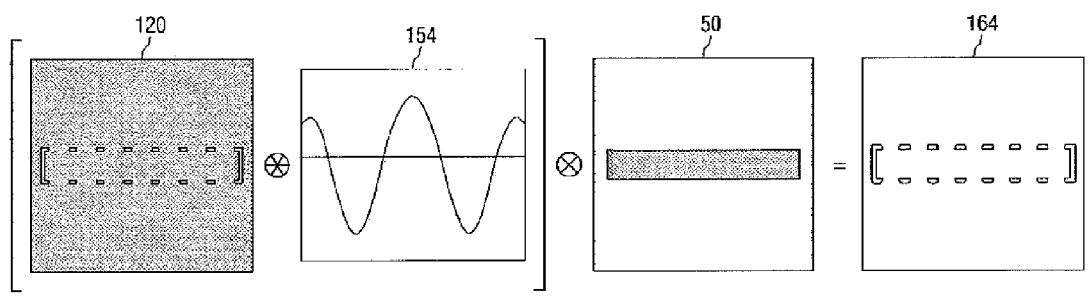

OPTICAL PROXIMITY CORRECTION MODELING METHOD AND SYSTEM

CROSS-REFERENCE TO RELATED APPLICATION

This application claims priority under 35 U.S.C. 119 from Korean Patent Application Nos. 10-2012-0095862 filed on Aug. 30, 2012 and 10-2012-0128939 filed on Nov. 14, 2012 in the Korean Intellectual Property Office, and all the benefits accruing therefrom, the contents of each of which are herein incorporated by reference in their entireties.

BACKGROUND

1. Technical Field

The present inventive concept is directed to an optical proximity correction modeling method and system.

2. Discussion of the Related Art

In the design of an integrated circuit, to form a desired circuit on a semiconductor substrate, after creating a layout of the circuit, the layout may be transferred to the surface of a wafer through a photomask. As the design of the integrated circuit is complicated due to the high integration of semiconductor devices, a pattern layout should be correctly implemented according to the initially intended design on the photomask that is used in a photolithography process.

As the wavelength of a light source used in an exposure apparatus becomes closer to a feature size of a semiconductor device, pattern distortion may occur due to diffraction, light interference, etc. Accordingly, an optical proximity effect occurs in which a pattern shape is distorted due to the influence of an adjacent pattern or an image having a different shape from an original shape is formed on the wafer. To avoid optical proximity effects such as changes in dimension, an optical proximity correction (hereinafter, referred to as OPC) process may be performed that predicts a change in pattern dimension, and transforms the design pattern in advance to obtain a pattern shape after a pattern transfer that corresponds to a desired layout.

SUMMARY

Embodiments of the present inventive concept provide an optical proximity correction (OPC) modeling method that can predict a topography effect due to a pattern stack structure.

Embodiments of the present inventive concept also provide an OPC modeling system that can predict a topography effect due to a pattern stack structure.

According to an aspect of the present inventive concept, there is provided an optical proximity correction modeling method for predicting a topography effect due to a pattern stack structure that includes a first material pattern, a second material pattern, and a boundary region between the first material pattern and the second material pattern. The method comprises: generating a first region filter that corresponds to the first material pattern, a second region filter that corresponds to the second material pattern, and an edge function that corresponds to the boundary region; generating a bulk image signal from a layout of a circuit using the first region filter and the second region filter; generating an edge image signal from the layout using the edge function, characteristic kernels that represent characteristics of the boundary region, the first region filter, and the second region filter; and generating a final model signal using the bulk image signal and the edge image signal.

According to another aspect of the present inventive concept, there is provided an optical proximity correction modeling method for predicting a topography effect due to a pattern stack structure that includes a first material pattern, a second material pattern, and a boundary region between the first material pattern and the second material pattern. The method comprises: generating a first region filter that corresponds to the first material pattern, a second region filter that corresponds to the second material pattern, and an edge function that corresponds to the boundary region; generating a weighted edge function from a layout of a circuit using the edge function; generating a first partial edge function from the weighted edge function using the first region filter and a first characteristic kernel that represents characteristics of the first material pattern in the boundary region; and generating a second partial edge function from the weighted edge function using the second region filter and a second characteristic kernel that represents characteristics of the second material pattern in the boundary region.

According to another aspect of the present inventive concept, there is provided an optical proximity correction modeling system for predicting a topography effect due to a pattern stack structure that includes a first material pattern, a second material pattern, and a boundary region between the first material pattern and the second material pattern. The system includes: a filter generating unit configured to generate a first region filter corresponding to the first material pattern, and a second region filter corresponding to the second material pattern; an edge function generating unit configured to generate an edge function corresponding to the boundary region; a bulk image generating unit configured to generate a bulk image signal from a layout of a circuit using the first region filter and the second region filter; an edge image generating unit configured to generate an edge image signal from the layout using the edge function, characteristic kernels that represents characteristics of the boundary region, the first region filter and the second region filter; and a final model generating unit configured to generate a final model signal using the bulk image signal and the edge image signal.

BRIEF DESCRIPTION OF THE DRAWINGS

FIG. 3 is a flowchart of an OPC modeling method in accordance with some embodiments of the present inventive concept.

FIG. 12 is a diagram of a weighted edge function generating step S331 of FIG. 5.

FIG. 13 is a conceptual diagram for FIG. 5.

DETAILED DESCRIPTION OF EXEMPLARY EMBODIMENTS

Features of the present inventive concept and methods of accomplishing the same may be understood more readily by reference to the following detailed description of exemplary embodiments and the accompanying drawings. Embodiments of the present inventive concept may, however, be embodied in many different forms and should not be construed as being limited to the embodiments set forth herein.

Figure 1:
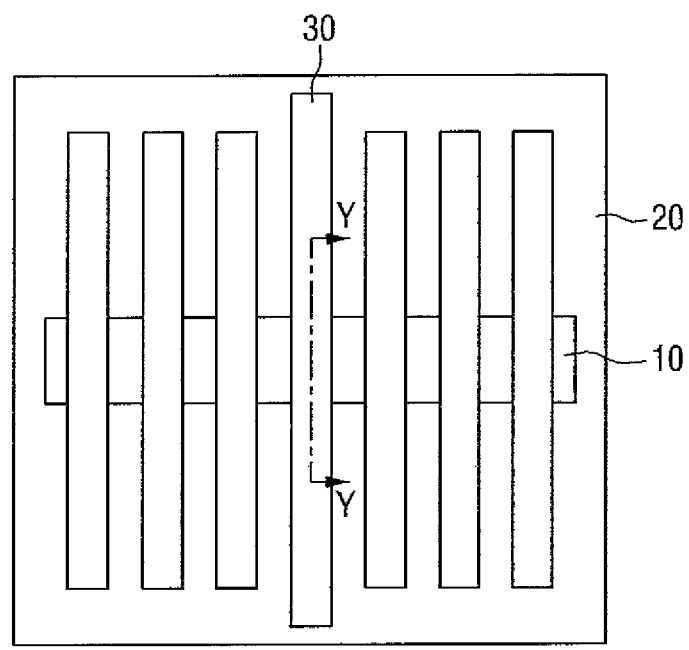
FIG. 1 is a plan view of a pattern stack structure and a mask.
Figure 2A:
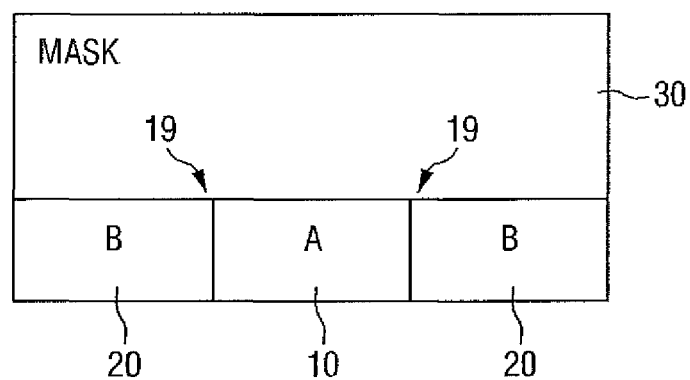
FIGS. 2A and 2B are cross-sectional views taken along line Y-Y of FIG. 1.
Figure 2B:
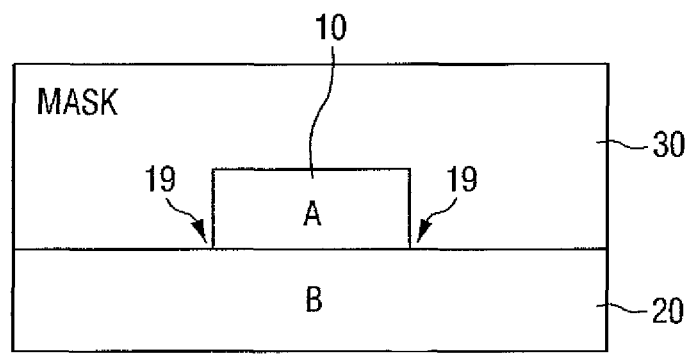

FIG. 1 is a plan view of a pattern stack structure and a mask. FIGS. 2A and 2B are cross-sectional views taken along line Y-Y of FIG. 1.

Referring to FIGS. 1, 2A and 2B, a pattern stack structure 10 and 20 is formed on a substrate. A pattern stack structure 10 and 20 is a structure formed below a mask 30 that includes two or more materials. On the other hand, a planar stack structure is a structure formed below a mask that includes only one material. As shown in FIG. 1, the pattern stack structure 10 and 20 may include, e.g., a first material pattern 10 and a second material pattern 20. The first material pattern 10 may extend in one direction (e.g., a horizontal direction), and the second material pattern 20 may surround the first material pattern 10. A cross-sectional view taken along line Y-Y of FIG. 1 is depicted in FIGS. 2A and 2B. In an exemplary embodiment shown in FIG. 2A, the upper surface of the first material pattern 10 and the upper surface of the second material pattern 20 may be substantially coplanar. Alternatively, in an exemplary embodiment shown in FIG. 2B, the first material pattern 10 may be formed on the second material pattern 20.

Although the pattern stack structure 10 and 20 illustrated in FIG. 1 includes two material patterns, embodiments of the present inventive concept are not limited thereto. For example, the pattern stack structure 10 and 20 may include three or more material patterns.

In addition, the structure formed below the mask 30 may affect the mask when the mask is formed. This effect is called a "topography effect." The shape of the mask 30 may vary depending on the stack structure formed below the mask 30.

Hereinafter, there will be described an OPC modeling method that can predict a topography effect due to the pattern stack structure 10 and 20. In an OPC modeling method in accordance with some embodiments of the present inventive concept, a region is divided into a boundary region and a bulk region, and each region is modeled independently. In this case, the boundary region is a boundary and adjacent region of the first material pattern 10 and the second material pattern 20, and the bulk region is the first material pattern 10 and the second material pattern 20 distant from the boundary region.

Figure 4:
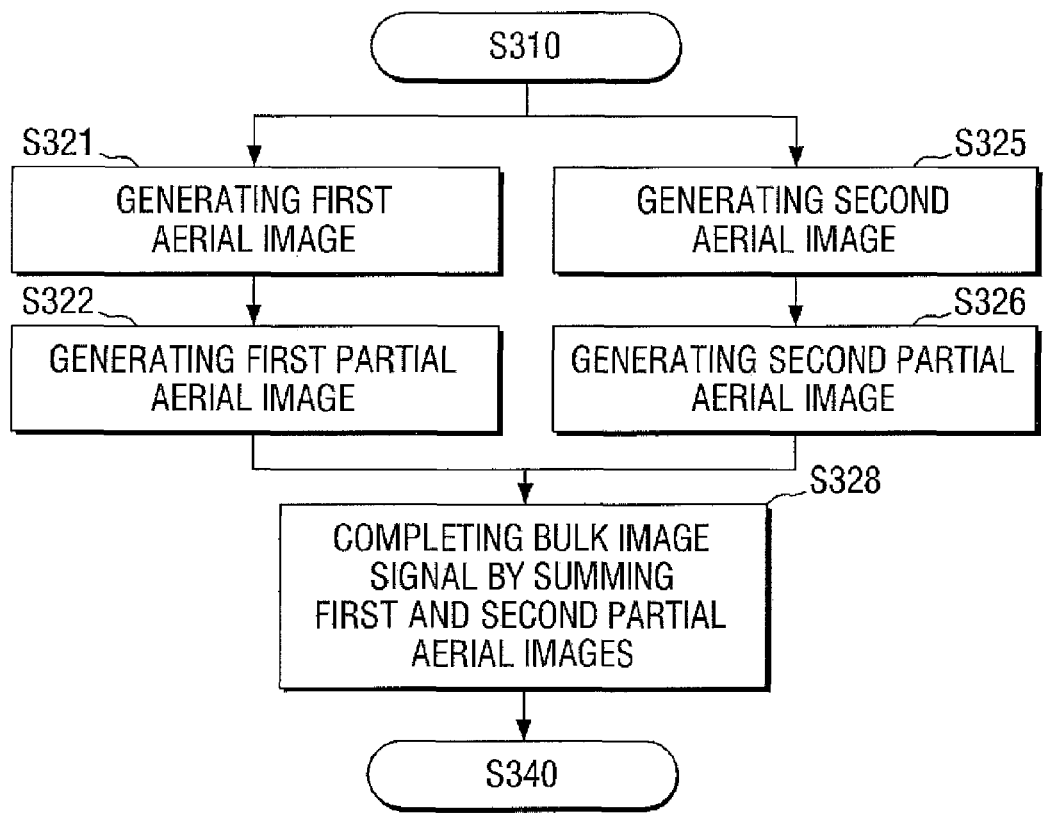
FIG. 4 is a flowchart of a bulk image signal generating step S320 of FIG. 3.
Figure 5:
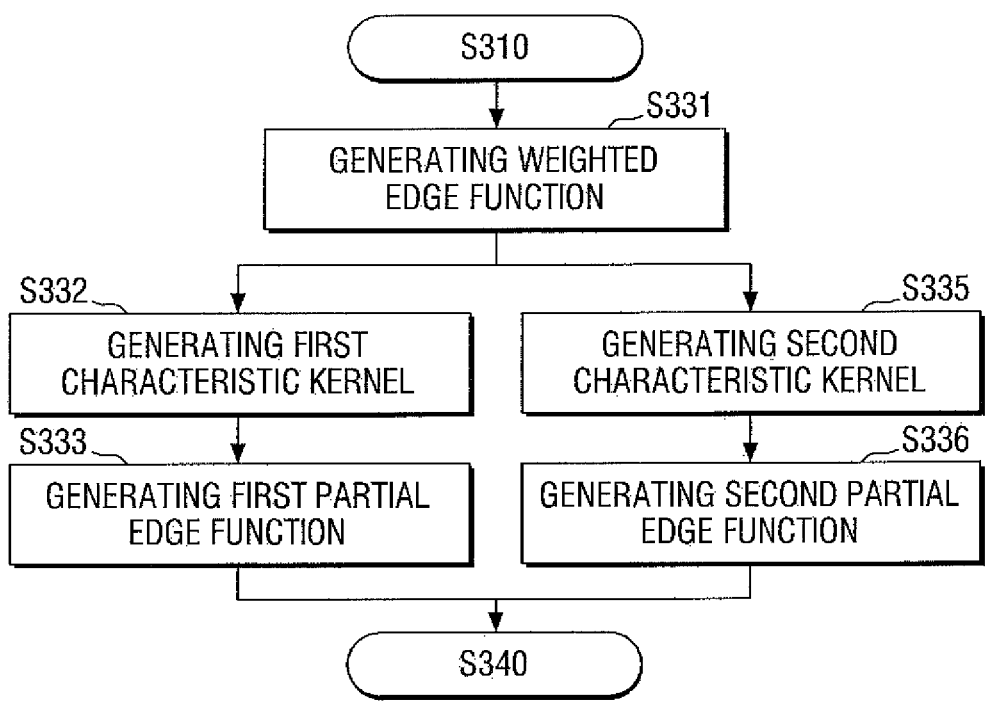
FIG. 5 is a flowchart of an edge image signal generating step S330 of FIG. 3.
Figure 6:
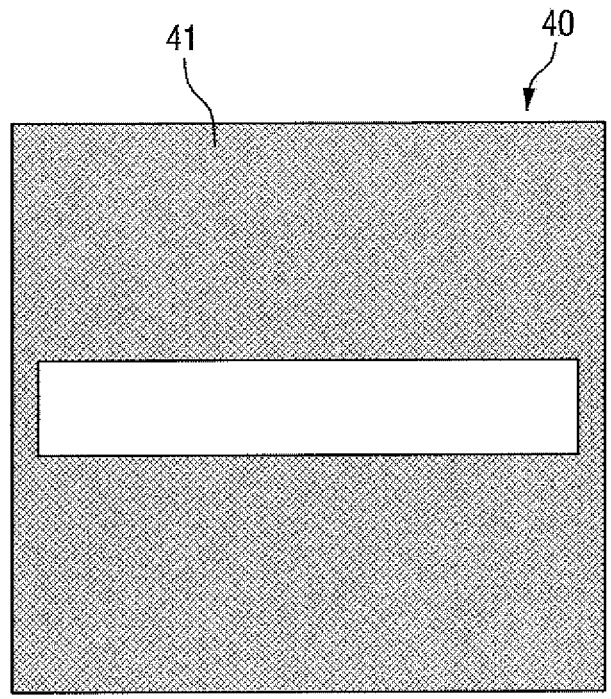
FIGS. 6 to 8 are diagrams of a first region filter, a second region filter and an edge function, respectively.
Figure 7:
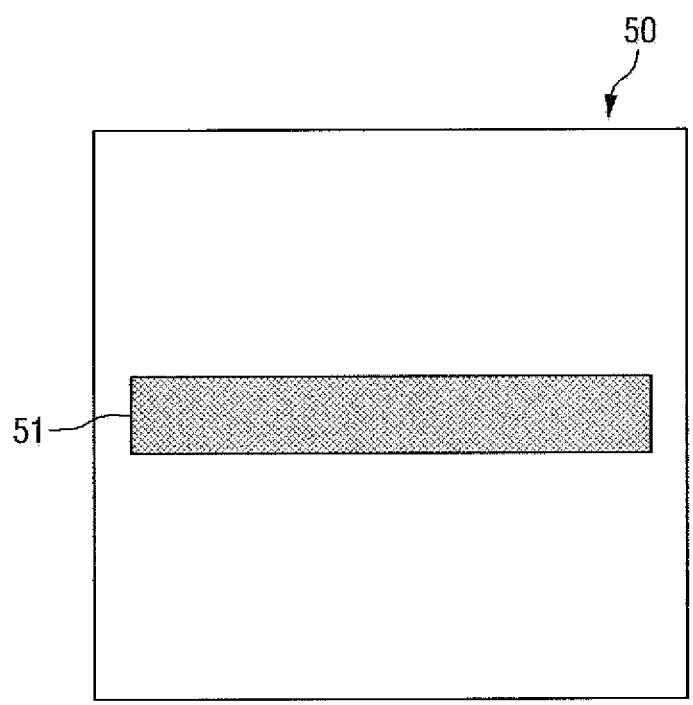
Figure 8:
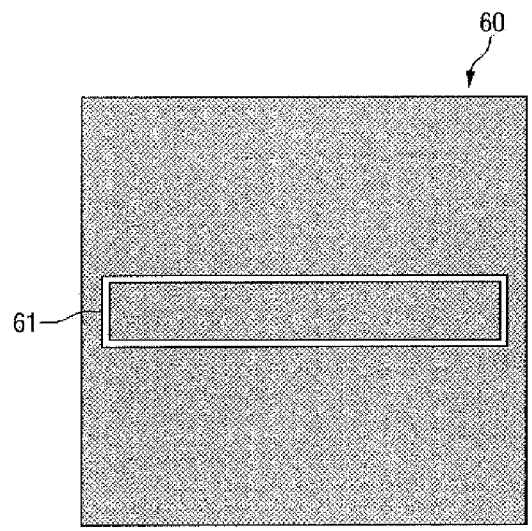
Figure 9:
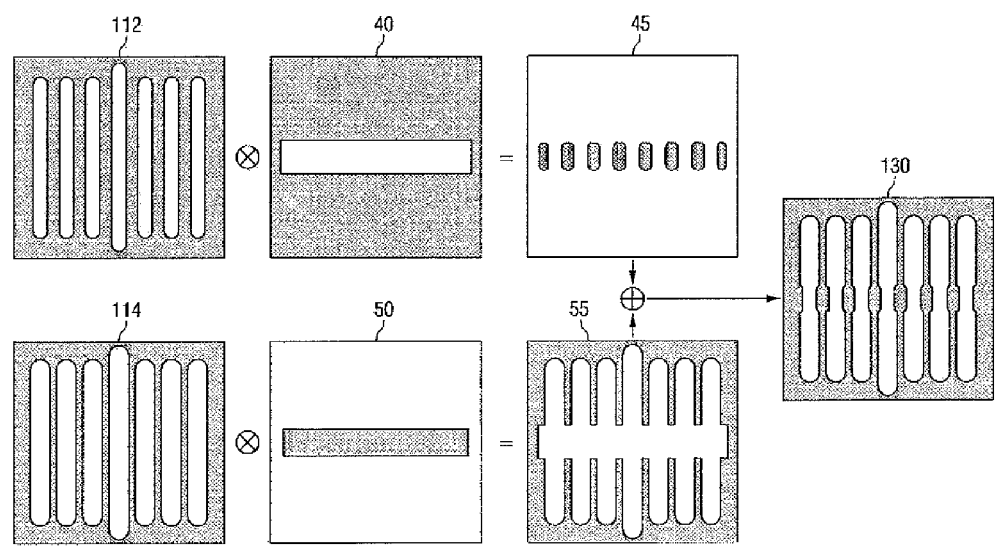
FIG. 9 is a conceptual diagram for FIG. 4.
Figure 10:
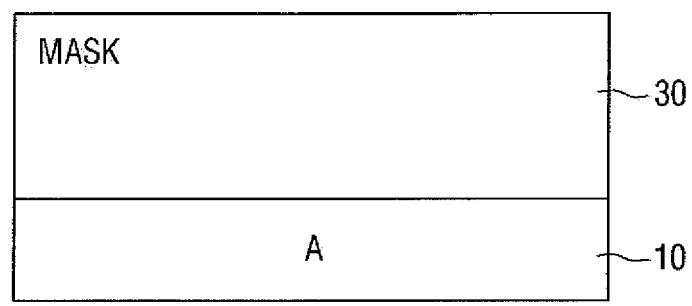
FIGS. 10 and 11 are diagrams of a first aerial image generating step S321, and a second aerial image generating step S325 of FIG. 4.
Figure 11:
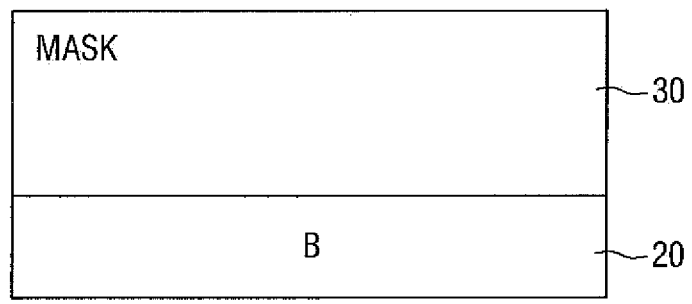
Figure 14:
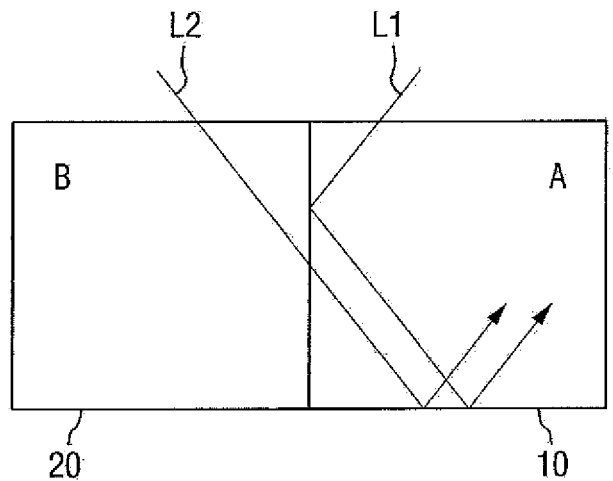
FIGS. 14 and 15 are conceptual diagrams of the light affecting the pattern of each material pattern.
Figure 15:
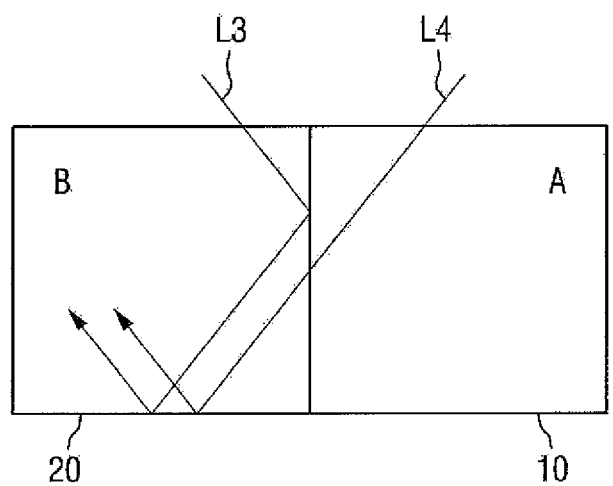
Figure 16A:
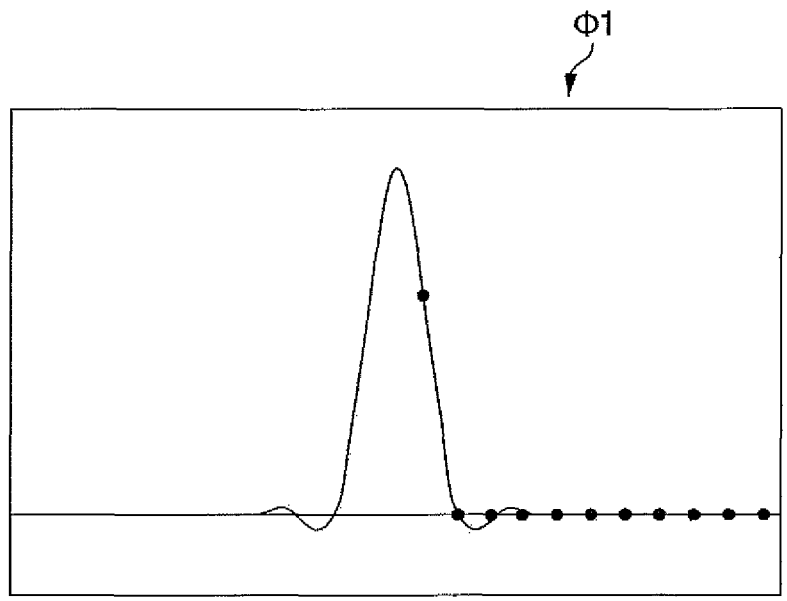
FIGS. 16A to 16E are diagrams of a set of unit kernels.
Figure 16B:
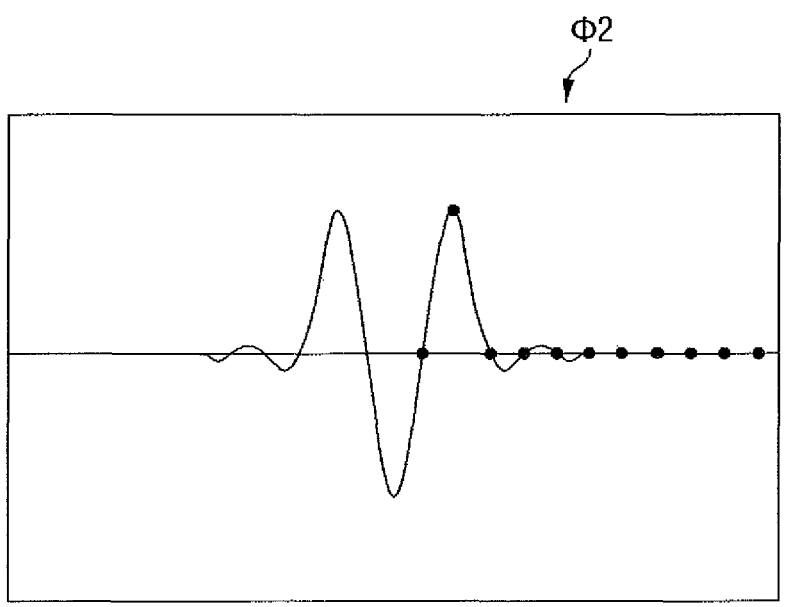
Figure 16C:
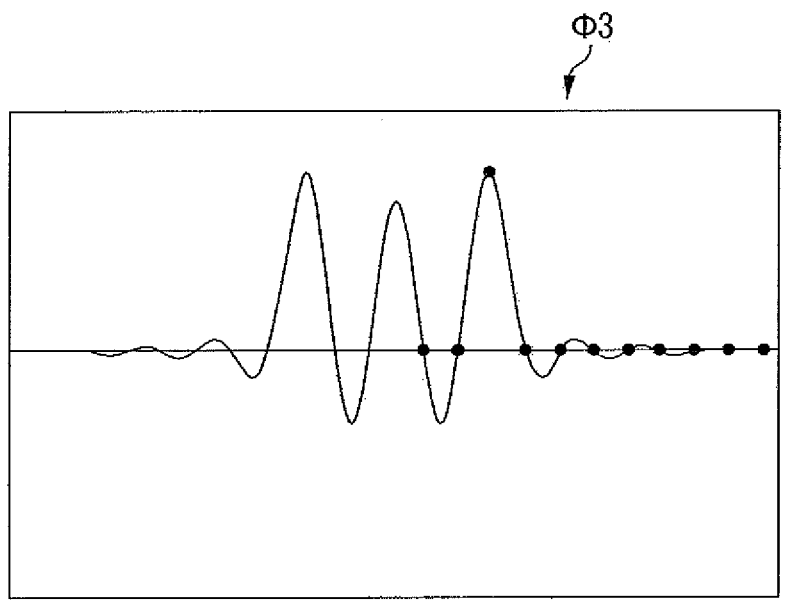
Figure 16D:
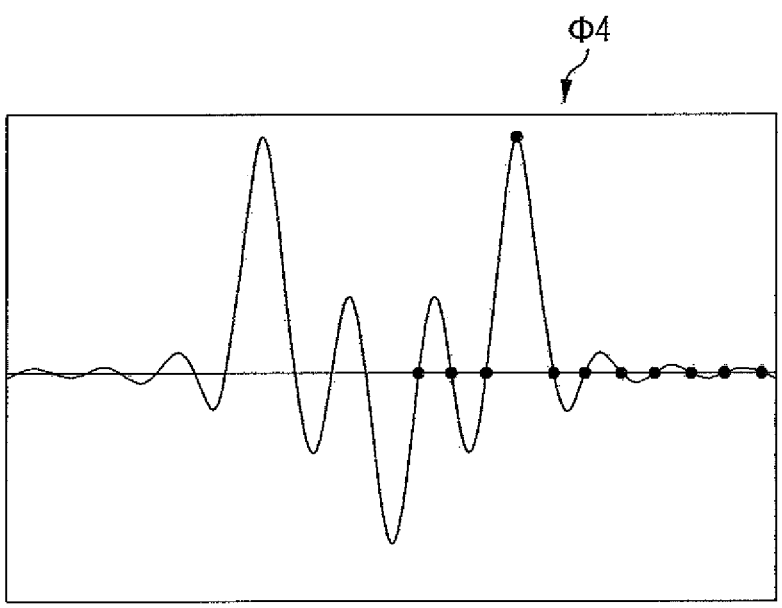
Figure 16E:
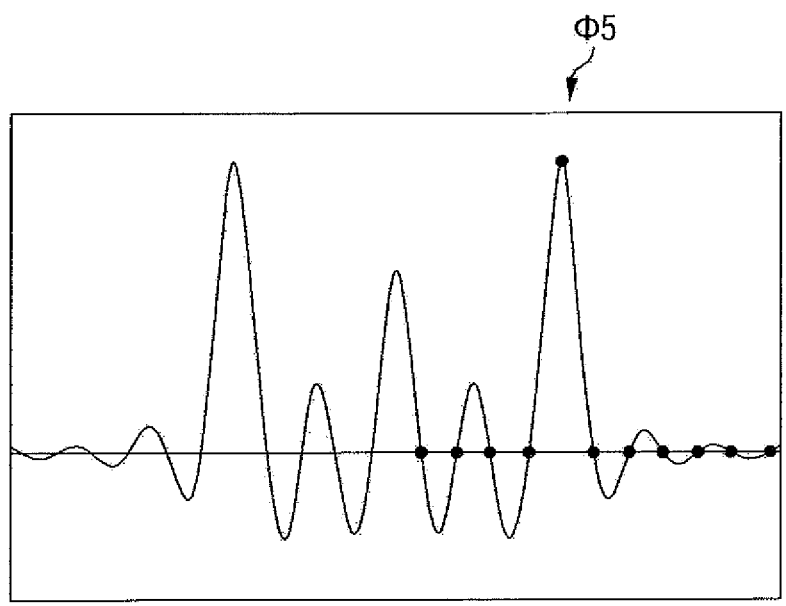
Figure 17:
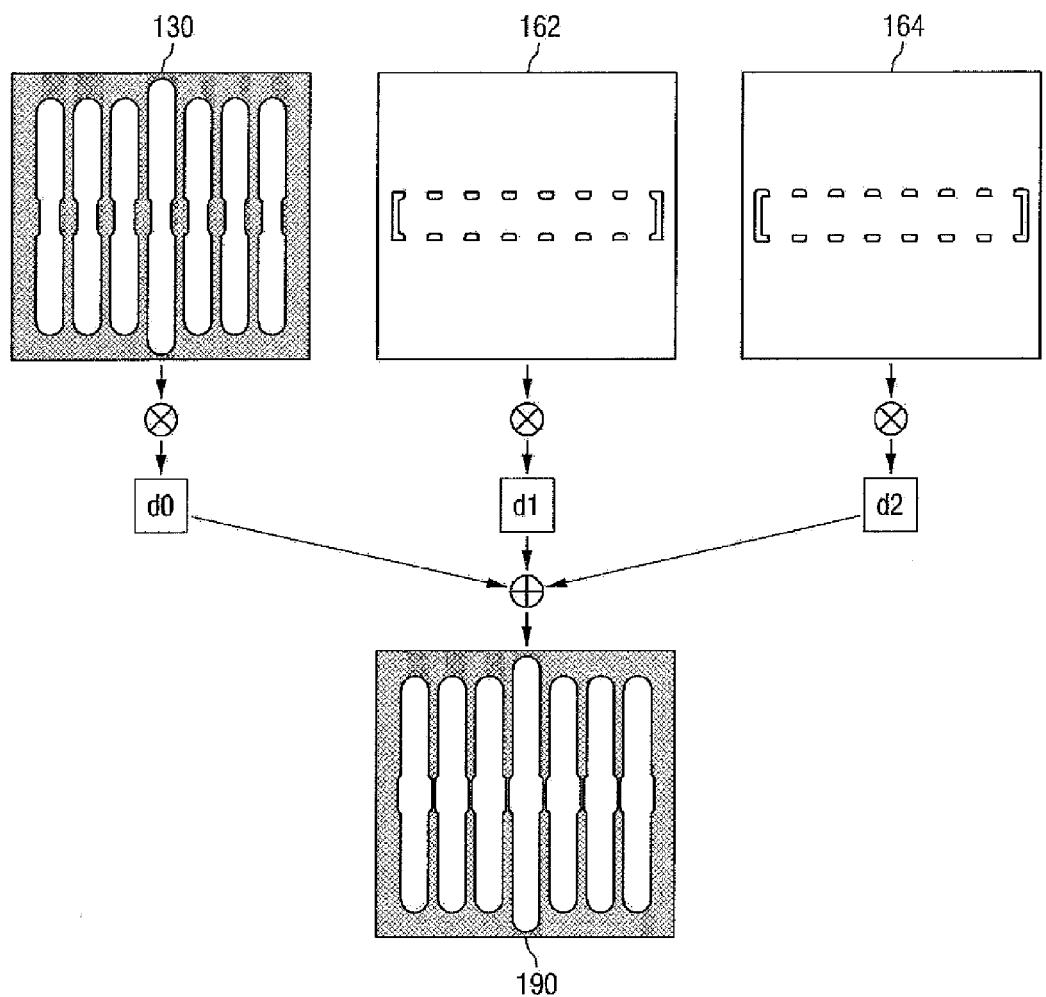
FIG. 17 is a conceptual diagram of a final model signal generating step S340 of FIG. 3.

FIG. 3 is a flowchart of an OPC modeling method in accordance with some embodiments of the present inventive concept. FIG. 4 is a flowchart of a bulk image signal generating step S320 of FIG. 3. FIG. 5 is a flowchart of an edge image signal generating step S330 of FIG. 3. FIGS. 6 to 8 are diagrams of a first region filter, a second region filter and an edge function. FIG. 9 is a conceptual diagram for FIG. 4. FIGS. 10 and 11 are diagrams for a first aerial image generating step S321, and a second aerial image generating step S325 of FIG. 4. FIG. 12 is a diagram of a weighted edge function generating step S331 of FIG. 5. FIG. 13 is a conceptual diagram for FIG. 5. FIGS. 14 and 15 are conceptual diagrams for the light affecting the pattern of each material pattern. FIGS. 16A to 16E are diagrams of a set of unit kernels. FIG. 17 is a conceptual diagram of a final model signal generating step S340 of FIG. 3.

First, referring to FIG. 3, a first region filter 40 (see FIG. 6) corresponding to the first material pattern 10, a second region filter 50 (see FIG. 7) corresponding to the second material pattern 20, and an edge function 60 (see FIG. 8) corresponding to a boundary region 19 are generated from the pattern stack structure 10 and 20 at step S310.

For example, the first region filter 40 may expose a portion of the first material pattern 10 and cover a portion 41 of the second material pattern 20. Further, the second region filter 50 may expose a portion of the second material pattern 20 and cover a portion 51 of the first material pattern 10. The edge function 60 may expose a boundary between the first material pattern 10 and the second material pattern 20 in the shape of a slit 61.

Referring again to FIG. 3, a bulk image signal is generated at step S320. The generation of the bulk image signal will be described in detail with reference to FIG. 4.

First, a first aerial image 112 (see FIG. 9) of a layout is generated at step S321. In this case, the first aerial image 112 may be, as shown in FIG. 10, a layout image based on the planar stack structure of the first material pattern 10. That is, the first aerial image 112 may be a layout image where the structure formed below the mask 30 includes only the first material pattern 10. This is because a region distant from the boundary region may be assumed to be a planar stack structure.

By multiplying the first aerial image 112 by the first region filter 40, a first partial aerial image 45 (see FIG. 9) is generated at step S322.

A second aerial image 114 (see FIG. 9) of the layout is generated at step S325. In this case, the second aerial image 114 may be, as shown in FIG. 11, a layout image based on the planar stack structure of the second material pattern 20. That is, the second aerial image 114 may be a layout image where the structure formed below the mask 30 includes only the second material pattern 20. This is because a region distant from the boundary region may be assumed as a planar stack structure.

By multiplying the second aerial image 114 by the second region filter 50, a second partial aerial image 55 (see FIG. 9) is generated at step S326.

Subsequently, by summing the first partial aerial image 45 and the second partial aerial image 55, a bulk image signal 130 is completed at step S328.

Referring again to FIG. 3, an edge image signal is generated at step S330. The generation of the edge image signal will be described in detail with reference to FIG. 5.

First, a weighted edge function is generated at step S331. As shown in FIG. 12, a weighted edge function 120 may be generated by multiplying a reflection image 110 of the layout by the edge function 60.

The reflection image 110 of the layout may be any image that can show a bright portion, i.e., portion not covered by the mask 30, and a dark portion, i.e., portion covered by the mask 30 of the layout.

For example, the reflection image 110 of the layout may be a layout image based on empty space. That is, the reflection image 110 of the layout may be a layout image when there is empty space below the mask 30, but it is not limited thereto.

As another example, the reflection image 110 of the layout may be the first aerial image 112 of FIG. 9, which shows a layout image based on the planar stack structure of a first material, or the second aerial image 114 of FIG. 9, which shows a layout image based on the planar stack structure of a second material. In this case, in a first partial edge function generating step S333, the first aerial image 112 may be used, and in a second partial edge function generating step S336, the second aerial image 114 may be used.

In an OPC modeling method in accordance with some embodiments of the present inventive concept, a first partial edge function and a second partial edge function are separately calculated.

First, a first characteristic kernel is generated at step S332.

A first characteristic kernel 152 (see FIG. 13) represents characteristics of the first material pattern 10 in the boundary region. That is, the first characteristic kernel 152 is a function that represents those elements affecting the first material pattern 10 in the boundary region. As shown in FIG. 14, light affecting the first material pattern 10 may be, e.g., light L1 reflected from the boundary between the first material pattern 10 and the second material pattern 20, and light L2 incident after being refracted from the second material pattern 20 into the first material pattern 10. The first characteristic kernel 152 represents physical phenomena due to various optical effects as described above.

For example, the first characteristic kernel 152 may be a linear combination of a set of unit kernels whose weights are distributed outward from the center. The linear combination may be the same as EQ. 1 below. The first characteristic kernel 152 is expressed by approximating a physical behavior that may occur in the boundary region by a linear system.

$$\Phi_c = \Sigma c_i \Phi_i \qquad (EQ. 1)$$

where $\Phi_c$ represents a first characteristic kernel, $\Phi_i$ represents a unit kernel, and $c_i$ represents a weight. In this case, a set of unit kernels may be a set of Bessel functions, but it is not limited thereto. For example, $\Phi_i$ (i=1, ..., 5) may have various forms as shown in FIGS. 16A to 16E. The $c_i$ may be determined after other parameters of the OPC model have been optimized based on the measurement results from the wafer.

Then, a first partial edge function 162 (see FIG. 13) is generated at step S333.

Specifically, the first partial edge function 162 may be generated from the weighted edge function 120 using the first characteristic kernel 152 and the first region filter 40. For example, the first partial edge function 162 may be generated by performing a first convolution on the weighted edge function 120 and the first characteristic kernel 152, and multiplying the result of the first convolution by the first region filter 40.

Meanwhile, a second characteristic kernel is generated at step S335.

A second characteristic kernel 154 (see FIG. 13) represents characteristics of the second material pattern 20 in the boundary region. That is, the second characteristic kernel 154 is a function that represents those elements affecting the second material pattern 20 in the boundary region. As shown in FIG. 15, light affecting the second material pattern 20 may be, e.g., light L3 reflected from the boundary between the first material pattern 10 and the second material pattern 20, and light L4 incident after being refracted from first material pattern 10 into the second material pattern 20. The second characteristic kernel 154 represents physical phenomena due to various optical effects as described above.

The second characteristic kernel 154 may be a linear combination of a set of unit kernels whose weights are uniformly distributed outward from the center similarly to the first characteristic kernel 152. The linear combination may be essentially the same as EQ. 1 above.

Subsequently, a second partial edge function 164 (see FIG. 13) is generated at step S336.

Specifically, the second partial edge function 164 may be generated from the weighted edge function 120 using the second characteristic kernel 154 and the second region filter 50. For example, the second partial edge function 164 may be generated by performing a second convolution on the weighted edge function 120 and the second characteristic kernel 154, and multiplying the result of the second convolution by the second region filter 50.

Referring again to FIG. 4, a final model signal 190 is generated at step S328 by using the bulk image signal 130 and the edge image signal 162 and 164.

Specifically, as shown in FIG. 17, the final model signal 190 may be generated by respectively multiplying the bulk image signal 130, the first partial edge function 162 and the second partial edge function 164 by weights d0, d1 and d2, and calculating the sum thereof.

In this case, an OPC modeling method in accordance with some embodiments of the present inventive concept as described with reference to FIGS. 1 to 17 can be expressed by the following equation. That is, the final model signal $W(\xi)$, where $\xi$ represents an image element, can be expressed by the following EQ. 2.

$$W(\xi) = d0(AI_{act}(\xi)F_{act}(\xi) + AI_{oxi}(\xi)F_{oxi}(\xi)) + \qquad (EQ. 2)$$
$$d1((E(\xi)AI_a(\xi)) \otimes \Phi_{in\_act}(\xi))F_{act}(\xi) +$$
$$d2((E(\xi)AI_a(\xi)) \otimes \Phi_{out\_act}(\xi))F_{oxi}(\xi)$$

where d0, d1, and d2 may be a coefficient of each term as shown in FIG. 17.

The first term of EQ. 2 represents the generation of the bulk image signal, and the latter two terms of EQ. 2 represent the generation of the partial edge function signals. In some embodiments, the two terms of the bulk image signal term may be individually weighted. In some embodiments, an edge function may be calculated as a weighted sum of the first and second partial edge function signals, and the final model signal may be calculated as a weighted sum of the bulk image signal and the edge function.

In other words, $AI_{act}(\xi)$ is the first aerial image based on the planar stack structure of the first material, and $F_{act}(\xi)$ is the first region filter corresponding to the first material pattern. $AI_{oxi}(\xi)$ is the second aerial image based on the planar stack structure of the second material, and $F_{oxi}(\xi)$ is the second region filter corresponding to the second material pattern.

Further, $E(\xi)$ may be the edge function corresponding to the boundary region, and $AI_a(\xi)$ may be the reflection image. $\Phi_{in\_act}(\xi)$ may be the first characteristic kernel that represents characteristics of the first material pattern in the boundary region, and $\Phi_{out\_act}(\xi)$ may be the second characteristic kernel that represents characteristics of the second material pattern in the boundary region.

Figure 18:
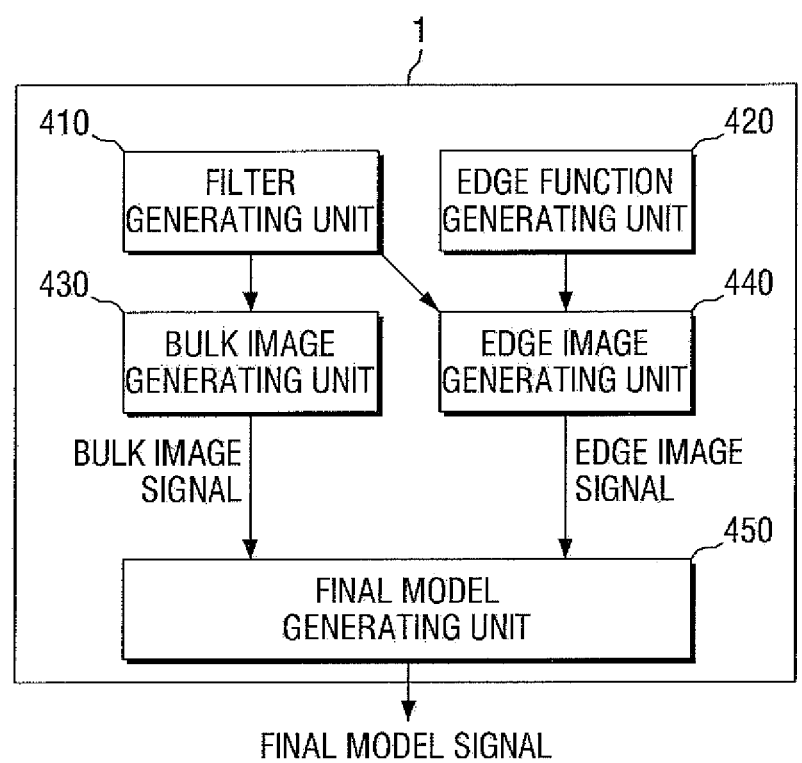
FIG. 18 is a block diagram of an OPC modeling system in accordance with some embodiments of the present inventive concept.

FIG. 18 is a block diagram of an OPC modeling system in accordance with some embodiments of the present inventive concept. The OPC modeling system of FIG. 18 is a system for implementing an OPC modeling method described with reference to FIGS. 1 to 17. For simplicity of description, a description of the parts described with reference to FIGS. 1 to 17 is omitted.

Referring to FIG. 18, an OPC modeling system 1 in accordance with some embodiments of the present inventive concept may predict a topography effect due to a pattern stack structure that includes a first material pattern, a second material pattern, and a boundary region between the first material pattern and the second material pattern. The OPC modeling system 1 may include a filter generating unit 410, an edge function generating unit 420, a bulk image generating unit 430, an edge image generating unit 440, a final model generating unit 450, etc.

The filter generating unit 410 may generate the first region filter 40 that corresponds to the first material pattern 10, and the second region filter 50 that corresponds to the second material pattern 20.

The edge function generating unit 420 may generate the edge function 60 that corresponds to the boundary region.

The bulk image generating unit 430 may generate a bulk image signal from the layout using the first region filter 40 and the second region filter 50.

The edge image generating unit 440 may generate an edge image signal from the layout using the edge function 60, characteristic kernels that represent characteristics of the boundary region, the first region filter 40 and the second region filter 50.

The final model generating unit 450 may generate a final model signal using the bulk image signal and the edge image signal.

In concluding the detailed description, those skilled in the art will appreciate that many variations and modifications can be made to the exemplary embodiments without substantially departing from the principles of the present disclosure. Therefore, the disclosed exemplary embodiments are used in a generic and descriptive sense only and not for purposes of limitation.

What is claimed is:

1. A computer-implemented optical proximity correction modeling method for predicting a topography effect due to a pattern stack structure that includes a first material pattern, a second material pattern, and a boundary region between the first material pattern and the second material pattern, said method performed by the computer comprising the steps of:
   generating a first region filter that corresponds to the first material pattern, a second region filter that corresponds to the second material pattern, and an edge function that corresponds to the boundary region;
   generating a bulk image signal from a layout of a circuit using the first region filter and the second region filter;
   generating an edge image signal from the layout using the edge function, characteristic kernels that represent characteristics of the boundary region, the first region filter, and the second region filter; and
   generating a final model signal using the bulk image signal and the edge image signal, wherein said final model signal is configured to correct the topography effect.

2. The optical proximity correction modeling method of claim 1, wherein the edge function exposes a boundary between the first material pattern and the second material pattern in a slit shape.

3. The optical proximity correction modeling method of claim 1, wherein generating the edge image signal comprises
   generating a weighted edge function from the layout using the edge function;
   generating a first partial edge function from the weighted edge function using the first region filter and a first characteristic kernel that represents characteristics of the first material pattern in the boundary region, and
   generating a second partial edge function from the weighted edge function using the second region filter and a second characteristic kernel that represents characteristics for the second material pattern in the boundary region.

4. The optical proximity correction modeling method of claim 3, wherein generating a weighted edge function comprises multiplying a reflection image of the layout by the edge function.

5. The optical proximity correction modeling method of claim 4, wherein the reflection image is a layout image.

6. The optical proximity correction modeling method of claim 3, wherein
   generating the first partial edge function comprises multiplying a first convolution of the weighted edge function and the first characteristic kernel by the first region filter, and
   generating the second partial edge function comprises multiplying a second convolution of the weighted edge function and the second characteristic kernel by the second region filter.

7. The optical proximity correction modeling method of claim 3, wherein each characteristic kernel is a linear combination of a set of unit kernels.

8. The optical proximity correction modeling method of claim 7, wherein the set of unit kernels is a set of Bessel functions.

9. The optical proximity correction modeling method of claim 1, wherein generating the bulk image signal comprises
   generating a first partial aerial image by multiplying a first aerial image of the layout by the first region filter,
   generating a second partial aerial image by multiplying a second aerial image of the layout by the second region filter, and
   generating the bulk image signal by summing the first partial aerial image and the second partial aerial image.

10. The optical proximity correction modeling method of claim 9, wherein the first aerial image is a layout image based on a planar stack structure of the first material, and the second aerial image is a layout image based on a planar stack structure of the second material.

11. The optical proximity correction modeling method of claim 1, wherein generating the final model signal comprises performing a weighted sum of the bulk image signal and the edge image signal.

12. An computer-implemented optical proximity correction modeling method for predicting a topography effect due to a pattern stack structure that includes a first material pattern, a second material pattern, and a boundary region between the first material pattern and the second material pattern, said method performed by the computer comprising the steps of:
   generating a first region filter that corresponds to the first material pattern, a second region filter that corresponds to the second material pattern, and an edge function that corresponds to the boundary region;
   generating a weighted edge function from a layout of a circuit using the edge function;
   generating a first partial edge function from the weighted edge function using the first region filter and a first characteristic kernel that represents characteristics for the first material pattern in the boundary region; and
   generating a second partial edge function from the weighted edge function using the second region filter and a second characteristic kernel that represents characteristics for the second material pattern in the boundary region,
   wherein said first region filter, said second region filter, said first partial edge function, and said second partial edge function are used to calculate a final model signal, wherein said final model signal is configured to correct the topography effect.

13. The optical proximity correction modeling method of claim 12, wherein generating the weighted edge function comprises multiplying a reflection image of the layout by the edge function.

14. The optical proximity correction modeling method of claim 13, wherein the reflection image is a layout image.

15. The optical proximity correction modeling method of claim 12, wherein
generating the first partial edge function comprises multiplying a first convolution of the weighted edge function and the first characteristic kernel by the first region filter, and
generating a second partial edge function comprises multiplying a second convolution of the weighted edge function and the second characteristic kernel by the second region filter.

16. The optical proximity correction modeling method of claim 12, further comprising
generating a bulk image signal by summing a first partial aerial image generated by multiplying a first aerial image of the layout by the first region filter and a second partial aerial image generated by multiplying a second aerial image of the layout by the second region filter, and
generating a said final model signal from a weighted sum of the bulk image signal, the first partial edge function, and the second partial edge function.

17. An optical proximity correction modeling system for predicting a topography effect due to a pattern stack structure that includes a first material pattern, a second material pattern, and a boundary region between the first material pattern and the second material pattern, said system comprising:
a filter generating unit configured to generate a first region filter corresponding to the first material pattern, and a second region filter corresponding to the second material pattern;
an edge function generating unit configured to generate an edge function corresponding to the boundary region;
a bulk image generating unit configured to generate a bulk image signal from a layout of a circuit using the first region filter and the second region filter;
an edge image generating unit configured to generate an edge image signal from the layout using the edge function, characteristic kernels that represents characteristics of the boundary region, the first region filter and the second region filter; and
a final model generating unit configured to generate a final model signal using the bulk image signal and the edge image signal,
wherein said final model signal is configured to correct the topography effect.

18. The optical proximity correction modeling system of claim 17, wherein the bulk image generating unit generates a first partial aerial image by multiplying a first aerial image of the layout by the first region filter, generates a second partial aerial image by multiplying a second aerial image of the layout by the second region filter, and generates the bulk image signal by summing the first partial aerial image and the second partial aerial image, wherein the first aerial image is based on a planar stack structure of the first material, and the second aerial image is based on a planar stack structure of the second material.

19. The optical proximity correction modeling system of claim 17, wherein the edge image generating unit
generates a weighted edge function by multiplying a reflection image of the layout by the edge function,
generates a first partial edge function by multiplying a first convolution of the weighted edge function and a first characteristic kernel that represents characteristics for the first material pattern in the boundary region by the first region filter,
generates a second partial edge function comprises multiplying a second convolution of the weighted edge function and a second characteristic kernel that represents characteristics for the second material pattern in the boundary region by the second region filter, and
generates the edge image signal from a weighted sum of the first partial edge function and the second partial edge function.

20. The optical proximity correction modeling system of claim 17, wherein the final model generating generates the final model signal from a weighted sum of the bulk image signal and edge image signal.

* * * * *